United States Patent
Suzuki

(10) Patent No.: US 6,864,954 B2
(45) Date of Patent: Mar. 8, 2005

(54) EXPOSURE PROCESS AND EXPOSURE DEVICE

(75) Inventor: Shinji Suzuki, Kanagawa-ken (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 255 days.

(21) Appl. No.: 10/281,960

(22) Filed: Oct. 29, 2002

(65) Prior Publication Data

US 2003/0081188 A1 May 1, 2003

(30) Foreign Application Priority Data

Oct. 30, 2001 (JP) ........................................ 2001-332092

(51) Int. Cl.[7] ........................... G03B 27/42; G03B 27/54
(52) U.S. Cl. ........................................ 355/53; 355/67
(58) Field of Search ........................ 355/50, 53, 67–71; 430/22, 311; 356/399–401; 250/548

(56) References Cited

U.S. PATENT DOCUMENTS

| 4,899,195 A | | 2/1990 | Gotoh | |
| 5,168,021 A | | 12/1992 | Arai et al. | |
| 5,929,976 A | | 7/1999 | Shibuya et al. | |
| 5,982,474 A | * | 11/1999 | Akiyama et al. | 355/53 |
| 6,052,173 A | * | 4/2000 | Miura et al. | 355/53 |

FOREIGN PATENT DOCUMENTS

| JP | 04-291914 | 10/1992 |
| JP | 05-030349 | 8/1993 |
| JP | 06-009487 | 3/1994 |

* cited by examiner

Primary Examiner—Henry Hung Nguyen
(74) Attorney, Agent, or Firm—Nixon Peabody LLP; David S. Safran

(57) ABSTRACT

To eliminate the disadvantage that determination of the alignment marks becomes difficult also in the case in which the peripheral area of the wafer is provided with alignment marks, a wafer, with a surface provided with alignment marks, and with a peripheral area provided with a singularly shaped point and to which a photoresist has been applied, is placed on a rotary stage and the edge position of the wafer and the singularly shaped point, such as a notch or the like, is determined by a device for determination of the singularly shaped point and the edge position. Based on the position information of the alignment marks formed in the wafer and based on the singularly shaped point and the edge position, a control element computes the positions of the alignment marks of the wafer which was seated on the rotary stage. Based on the above described computation result, the area which is irradiated with the exposure light and the positions of the alignment marks on the wafer are brought into agreement with one another. In this way, the photoresist which has been applied to the alignment marks is exposed. This exposure is carried out for each formation of a pattern on the substrate and thus the film formed on the alignment marks is eliminated.

4 Claims, 14 Drawing Sheets form of exposure light emerging from the exposure light exit part of the device for irradiation of the peripheral area (irradiation area S)

EXPOSURE PROCESS AND EXPOSURE DEVICE

BACKGROUND OF THE INVENTION

1. Field of the Invention

The invention relates to an exposure process in which a substrate is irradiated with UV light, in which outside the area in which a pattern is formed (area in which a semiconductor component (a circuit pattern or the like) is formed), alignment marks are formed, and to which a photoresist has been applied, and in which the photoresist which has been applied to the area provided with the alignment marks is thus exposed. The invention furthermore relates to a device for carrying out the process.

2. Description of Related Art

In the exposure of a mask pattern formed in a mask, such as a circuit or the like, onto a substrate (hereinafter called a "wafer"), the mask is positioned relative to the wafer to expose the mask pattern onto a given location of the wafer. For this positioning, the mask is provided with mask alignment marks and the workpiece is provided with workpiece alignment marks. The mask and the workpiece are moved such that the positional ratio of the two alignment marks becomes a given positional ratio (for example, agrees with a given positional ratio) and they are positioned relative to one another. The mask pattern is thus exposed onto the wafer and a pattern is formed on the wafer. Workpiece alignment marks (hereinafter called only "alignment marks") are used for positioning of the mask to the workpiece, as was described above. Normally alignment marks are located outside the area in which a pattern, such as a circuit or the like, is formed.

Depending on the exposure device to be used, there are cases in which the alignment marks are located in the peripheral area of the region of the pattern to be formed in the wafer, as is shown, for example, in FIG. 10. In one such case, as is described below, films are placed in multiple layers on one another on the alignment marks AM, when the pattern is formed by a conventional process. As the process continues, the poorer the visual detectability of the alignment marks becomes and the more difficult it is to determine them.

The production of a pattern by the conventional process in the case of an arrangement of the alignment marks in the peripheral area of the wafer is described below in a simplified manner using FIGS. 11(a) to 11(n).

(1) First, alignment marks and an element pattern are formed on the wafer. To form the alignment marks and the element pattern on the wafer there is an exposure process, a development process and the like, which are however not described here.

Alignment marks AM are formed in the peripheral area of the wafer W by the above described process, as is shown in FIG. 11(a). FIG. 11(a) is a cross section in which the wafer W has been cut by a plane which is perpendicular to its surface. The top of the wafer W, as is shown below using FIG. 11(n), is provided, for example, with cross-shaped alignment marks AM (FIG. 11(a) is a cross section corresponding to line A—A as shown in FIG. 11(n)).

(2) As is shown in FIG. 11(b), on the wafer which is provided with the alignment marks AM and the element pattern, films such as oxide films ($SiO_2$), nitride films (SiN) and the like are formed.

(3) As is shown in FIG. 11(c), a resist is applied.

(4) As is shown in FIG. 11(d), the mask pattern (element pattern) is exposed. Here, positioning of the mask relative to the workpiece is using the alignment marks AM on the wafer W and the mask alignment marks located in the mask. In FIG. 11(d), the exact arrangement of the element pattern is not shown.

As is shown in FIG. 11(e), the peripheral area is exposed.

(6) The resist is developed. For a positive resist, as is shown in FIG. 11(f), the exposed area is dissolved in a development solution.

(7) As is shown in FIG. 11(g), the films are etched, the resist being used as a mask. The films in the area in which there is no resist are removed.

(8) As is shown in FIG. 11(h) the resist is detached. In this way, the second pattern layer is formed.

(9) As is shown in FIGS. 11(i) to 11(k), layer formation (in FIG. 11(i) polysilicon (poly-Si)) is performed, the resist is applied and exposure carried out. Furthermore, as is shown in FIGS. 11(l) to 11(n), development, etching and removal are performed, and thus, the third pattern layer is formed. In this way, a second film layer and a third film layer are formed on the alignment marks AM which are formed in the peripheral area of the wafer, as is shown in FIG. 11(n).

In the above described process, a multilayer film is deposited on the alignment marks, the farther the process continues, as was described above. By absorption of light by the respective layer, and by refraction of the light on the boundary surface, in the positioning of the mask relative to the workpiece, the visual detectability of the alignment marks is degraded, by which determination gradually becomes difficult.

In order to prevent the above described disadvantage, in a conventional exposure device of the "step & repeat" type (stepper), in the peripheral area of the respective element pattern (in the gap between the respective element patterns within the region in which the pattern is formed), there are alignment marks. Upon each exposure of the pattern new alignment marks were exposed on the uppermost formed layer of the peripheral area (gap) of the respective element pattern.

However, in the case in which the alignment marks are located in the peripheral area of the wafer, as is shown in FIG. 10, the above described process cannot be used. As is shown in FIG. 11(n), a multilayer film is deposited on the alignment marks. The farther the process continues and the more layers are deposited, the more the visual detectability is degraded and the more difficult the determination of the alignment marks.

If, independently of a mask with a pattern, such as a fine circuit or the like, which is formed in the actual workpiece, a mask is used in which a pattern for exposure of the alignment marks is formed, and if in the manner shown in FIG. 10, the alignment marks located in the peripheral area of the wafer are exposed, the above described disadvantage can be eliminated. However, if a stepper is used for exposure only of the areas of the alignment marks, the production rate capacity for exposure of a fine circuit pattern, which is the actual purpose, is accordingly smaller.

SUMMARY OF THE INVENTION

The invention was devised to eliminate the above described disadvantages in the prior art. Thus, a first object of the invention, in the case in which the peripheral area of the wafer is provided with alignment marks, is to eliminate the disadvantage that determination of the alignment marks becomes difficult.

A second object of the invention is to be able to expose a resist on the alignment marks or in their vicinity using a device for exposure of the peripheral area, and thus, to increase the production rate capacity of the stepper without using an exposure device by which a fine pattern is formed, such as a stepper or the like.

The above described objects are achieved in accordance with the invention as follows:

(1) In an exposure process in which a substrate is irradiated with UV light via a mask, in which outside the area in which a pattern is formed (area in which a semiconductor component, e.g., a circuit pattern or the like, is formed), alignment marks are formed, and to which a photoresist has been applied, and in which the mask pattern is exposed onto the substrate, with each exposure of the mask pattern onto the substrate, the areas which are provided with the above described alignment marks are irradiated with exposure light and the photoresist is exposed on the areas provided with the alignment marks. This treatment is repeated.

By the above described measure that, upon each exposure of the mask pattern onto the substrate, the areas which are provided with the above described alignment marks are irradiated with exposure light and that the photoresist is exposed on the areas provided with the alignment marks, it is possible to eliminate the film which is formed on the areas provided with the alignment marks. Even if the process continues, easy determination of the alignment marks when the mask is positioned to the workpiece is enabled.

(2) In an exposure device in which a substrate with a surface which is provided with alignment marks, with an outside peripheral area provided with a singularly shaped point, and to which a photoresist has been applied, is seated on a rotary stage, in which furthermore this rotary stage and an area irradiated with exposure light are moved relative to one another, and in which the photoresist is exposed in the peripheral area of this substrate, there are the following components:

a means for determining the singularly shaped point and the edge position which determines the singularly shaped point and the edge position of the above described substrate; and a control element which is designed to store the position information of the alignment marks formed on the above described substrate, and based on the edge position information and the information about the singularly shaped point which has been obtained by the means for determining the singularly shaped point and the edge position, and based on position information of the alignment marks formed on the above described substrate, to compute the positions of the alignment marks on the substrate which has been placed on the above described rotary stage.

Based on the computation result, in the above described control element, the above described area which is irradiated with exposure light and the positions of the alignment marks in the above described rotary stage are brought into agreement with one another. Thus, the photoresist which has been applied to the areas which are provided with the above described alignment marks are exposed.

This means that the above described control element turns the wafer, determines the position of the wafer edge by the means for wafer edge determination, determines the amount and direction of deviation of the position of the center of rotation of the rotary stage from the position of the wafer center, and computes the position of the singularly shaped point. Based on the amount of this deviation, the deviation direction and the position of the singularly shaped point the rotary stage and the exposure light outlet part are moved relative to one another, and the area irradiated with the exposure light is moved in such a way that the positions of the alignment marks which have been input beforehand are irradiated on the wafer with the exposure light.

Then, the exposure light is emitted from the exposure light outlet part. Thus, the photoresist which has been applied to the areas which are provided with the alignment marks is exposed. In the case in which there are several alignment marks for exposure, the area which is provided with the respective alignment marks is exposed in the same way as above described.

(3) In an exposure device in which a substrate with a surface which is provided with alignment marks, with an outside peripheral area provided with a singularly shaped point, and to which a photoresist has been applied, is seated on a rotary stage, in which, furthermore, by turning this rotary stage, this substrate is turned, and at the same time, the area irradiated with exposure light is moved relative to the area with a given width from the edge of this substrate, and in which the photoresist is exposed in the peripheral area of the substrate, there are the following components:

a means for determining the singularly shaped point and the edge position, which is formed by a projection part which projects sensor light and of a light receiving part which receives this sensor light and which determines the singularly shaped point and the edge position of the above described substrate; and a device for moving the means for determining the singularly shaped point and the edge position which moves the means for determining the singularly shaped point and the edge position essentially in the direction to the middle of the substrate;

a device for moving the irradiated area which moves the area irradiated with the exposure light; and a control element which controls the device for moving the means for determining the singularly shaped point and the edge position such that the sensor light is projected by the projection part onto the peripheral area of the substrate, that the sensor light emitted onto the edge area of the substrate is received by the light receiving part, and that the amount of light received becomes essentially constant, and which controls the device for moving the irradiated area such that the above described irradiated area is moved in the same direction of motion and by the same amount of motion as the means for determining the singularly shaped point and the edge position.

The above described control element stores the position information of the alignment marks formed on the substrate, based on the edge position information and the position information about the singularly shaped point which was obtained by the means for determining the singularly shaped point and the edge position, and based on the position information of the alignment marks formed on the substrate, computes the positions of the alignment marks on the substrate which was seated on the rotary stage, based on the computation result in the control element causes the area irradiated with the exposure light to agree with the position of the alignment marks for the rotary stage, and exposes the photoresist which has been applied to the areas provided with the alignment marks.

This means that the control element turns the above described wafer, determines the position of the wafer edge by the means for wafer edge determination, determines the amount and direction of deviation of the position of the center of rotation of the rotary stage from the position of the wafer center, and computes the position of the singularly shaped point based on the amount of change of the output of the means for determining the singularly shaped point and the edge position. Based on this amount of deviation, the deviation direction and the position of the singularly shaped point, the position coordinates of the alignment marks which were input beforehand are converted into the coordinate system of the rotary stage and the positions of the alignment marks are determined in the coordinate system of the rotary stage. Furthermore, the rotary stage and the exposure light outlet part are moved relative to one another, and the area irradiated with exposure light is moved such that the positions of the alignment marks input beforehand on the wafer are irradiated with exposure light.

Next, exposure light is emitted from the exposure light outlet part and the photoresist which was applied to the areas provided with the alignment marks is thus exposed. In the case in which there are several alignment marks for exposure, the respective alignment mark is exposed in the same way as described above.

By exposing the alignment marks using the device for exposing the peripheral area in the manner described in (2) and (3), the exposure of the alignment marks on the wafer need not be done by the stepper, by which the production rate capacity of the stepper can be increased.

Furthermore, by the measure that the device for exposure of the peripheral area requires the function of exposure of the alignment marks, an entry into the process is enabled in which peripheral area exposure is performed. Therefore, it is not necessary to procure a device for exposing the alignment marks in addition.

Moreover, a device for exposing the peripheral area and a device for exposing the alignment marks can be used. The areas of the alignment marks can also be exposed by adding only one pair of functions to the device for exposing the peripheral area. The cost increase is thus low.

(4) In the above described items (2) and (3), there are a shielding plate with an opening which corresponds to the size of the alignment mark formed on the substrate, and a device for driving the shielding plate which carries out insertion/removal of the above described shielding plate into the area irradiated with exposure light. In the exposure of the photoresist which was applied to the areas provided with the alignment marks, the shielding plate is moved by the device for driving the shielding plate to the area irradiated with the exposure light. The photoresist which has been applied to the areas provided with the alignment marks is exposed via the opening of the shielding plate.

The arrangement described in (4) above can prevent a ghost by the lens located in the exposure light outlet part and yield spot light with good contrast.

The invention is further described below using several embodiments shown in the drawings.

DETAILED DESCRIPTION OF THE INVENTION

Versions of the invention are described below.

First, the process of pattern formation in accordance with a first embodiment of the invention will be described using FIGS. 1(a) to 1(p) and using the process flow chart shown in FIG. 2. In the embodiment described below, a wafer is described which has a notch. However, the invention can also be applied to a wafer which has an orientation flat, and to an angular substrate.

Figure 1A:
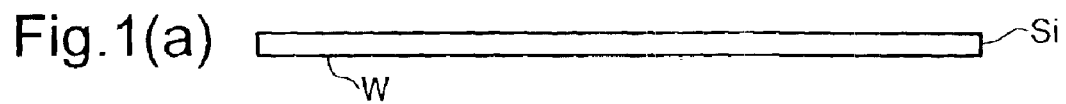
FIGS. 1(a) to 1(p) each schematically show a respective step of the process of pattern formation in one embodiment of the invention.
Figure 1B:
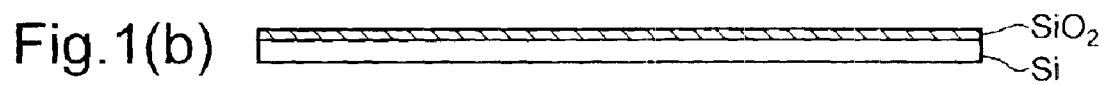
Figure 2:
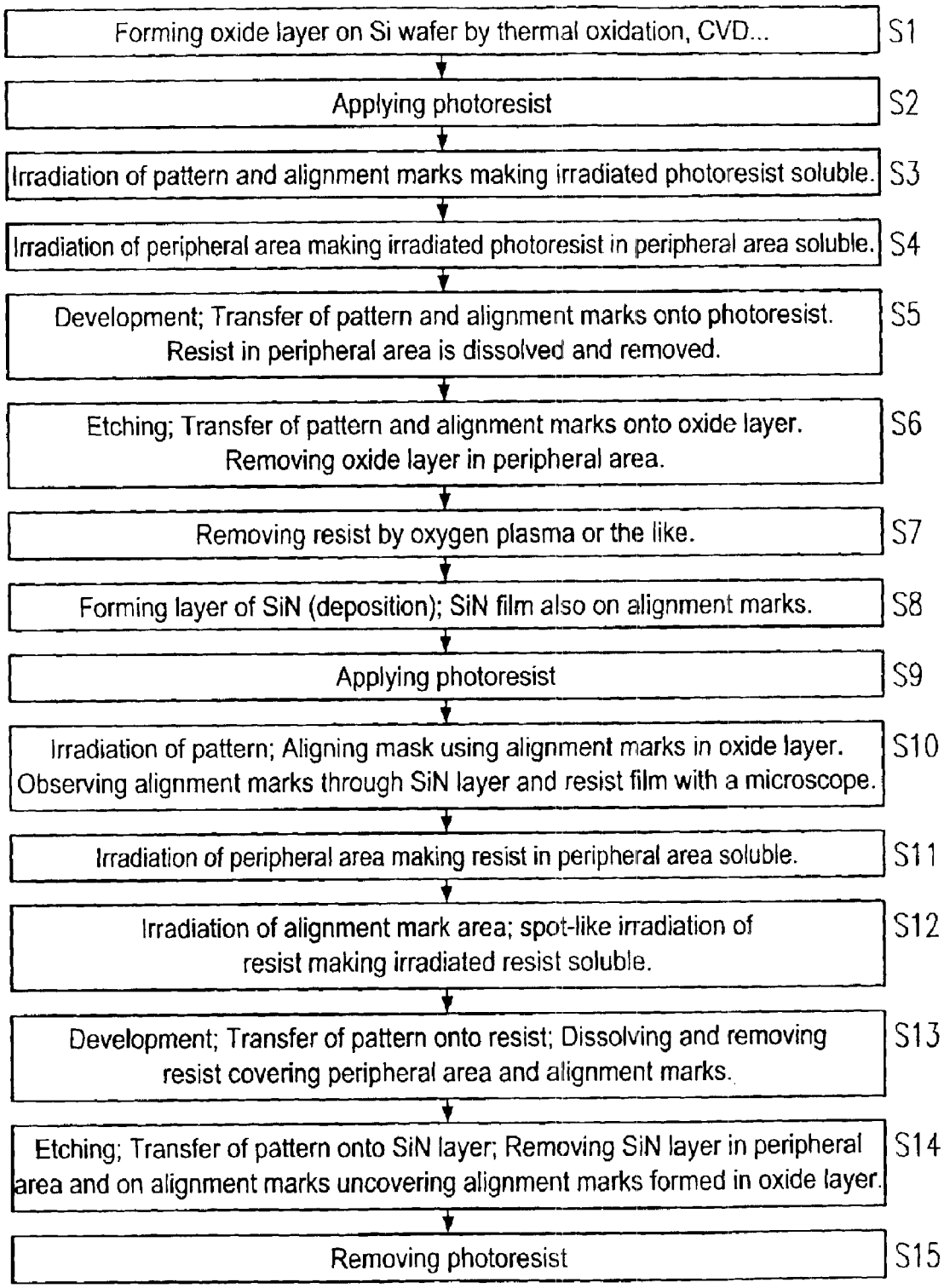
FIG. 2 is a flow diagram of the process of pattern formation.

(1) A film, such as an oxide film ($SiO_2$), a nitride film (SiN) or the like is formed on a Si substrate (a wafer) which is shown in FIG. 1(a), by thermal oxidation, by CVD or the like, as is shown in FIG. 1(b) (step S1 in FIG. 2). In this example, a silicon oxide film ($SiO_2$) is formed.

Figure 1C:
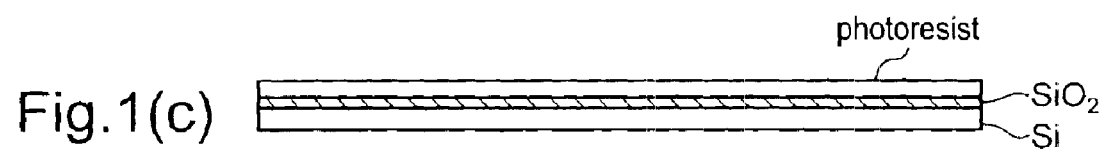
Figure 1D:
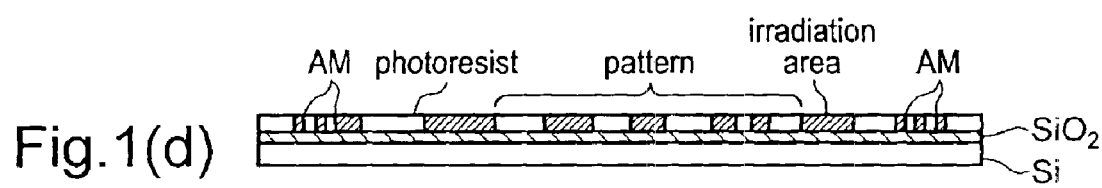

(2) As shown in FIG. 1(c), the resist is applied (step S2 in FIG. 2). By a stepper or the like, an element pattern and alignment marks AM are exposed, as is shown in FIG. 1(d) (step S3 in FIG. 2). In FIG. 1(d) the exact arrangement of the element pattern is not shown.

Figure 1E:
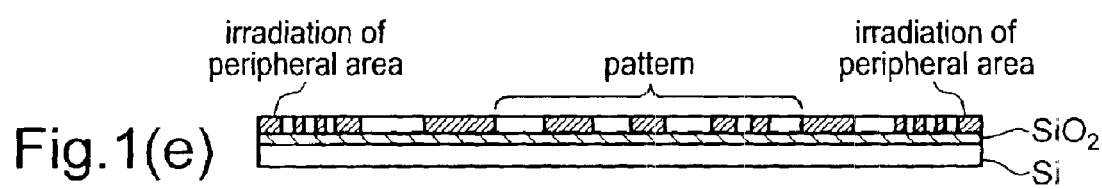

(3) As shown in FIG. 1(e), peripheral area exposure is performed in order to eliminate unnecessary resist in the peripheral area of the wafer (step S4 in FIG. 2). Peripheral area exposure is produced by the device for exposure of a peripheral area described below.

Figure 1F:
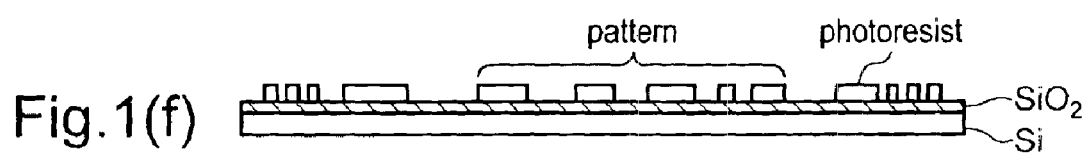

(4) The resist is developed (step S5 in FIG. 2) and the exposed area is dissolved in a development solution for a positive resist, as is shown in FIG. 1(f).

Figure 1G:
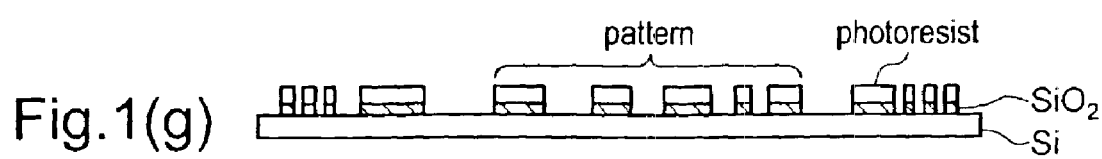

(5) As is shown in FIG. 1(g), the film is etched, the resist being used as a mask. The film in the area which does not have any resist is eliminated (step S6 in FIG. 2).

Figure 1H:
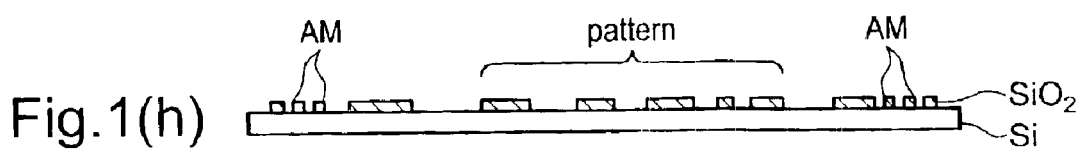

(6) The resist is removed by a removal agent such as oxygen plasma or the like (step S7 in FIG. 2). In this way, as is shown in FIG. 1(h), the first element pattern layer and alignment marks AM are formed on the wafer. FIG. 1(h) is a cross section in which the wafer has been cut along a plane which is perpendicular to its surface. The top of the wafer is provided with alignment marks AM such as that shown in FIG. 1(p).

Figure 1I:
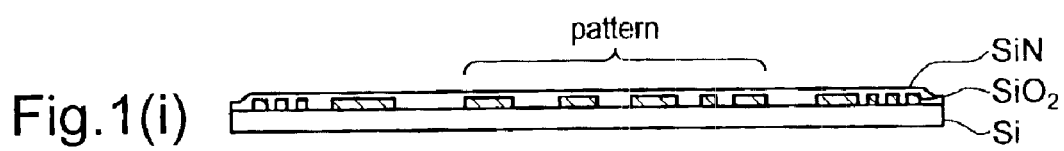

(7) As is shown in FIG. 1(i), a film, such as an oxide film ($SiO_2$), a nitride film (SiN) or the like is formed (in this example, a silicon nitride film (SiN) is formed). The SiN film is also formed on the alignment marks AM (step S8 in FIG. 2).

Figure 1J:
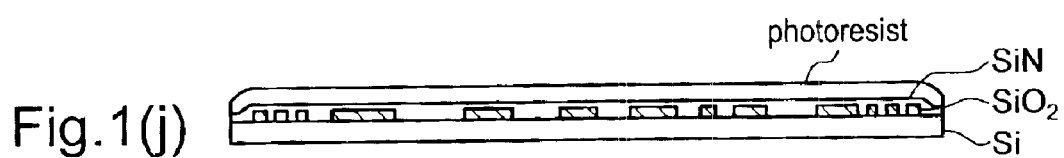
Figure 1K:
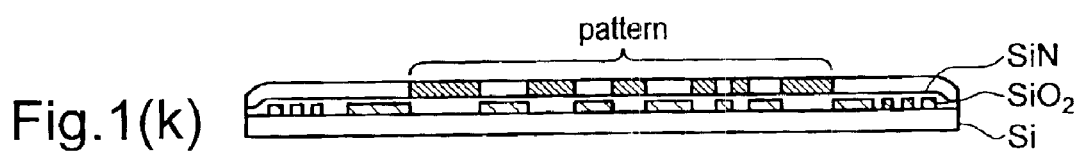
Figure 1L:
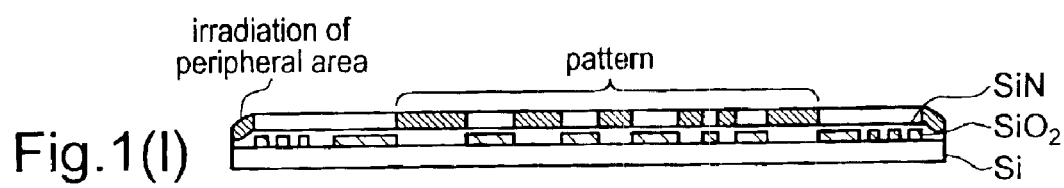

(8) As is shown in FIG. 1(j), a resist is applied (step S9 in FIG. 2). As was described above, using the alignment marks AM formed on the wafer, the mask is positioned relative to the workpiece, and the second element pattern layer is exposed, as is shown in FIG. 1(k) (step S10 in FIG. 2). The resist film is normally transparent. The alignment marks AM can be observed through the SiN film and the resist film with an alignment microscope. Furthermore, as is shown in FIG. 1(l), the peripheral area is exposed (step S11 in FIG. 2).

Figure 1M:
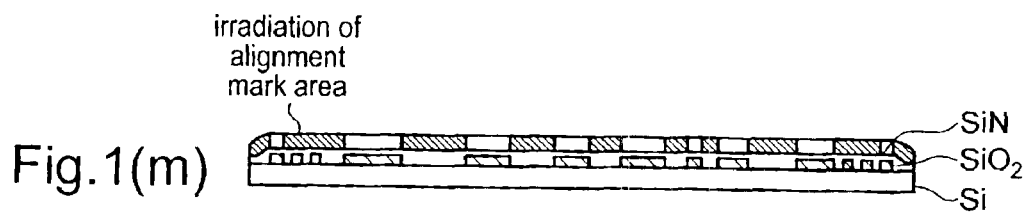

(9) As is shown in FIG. 1(m), the resist is exposed on the alignment mark areas spot-like, in order to eliminate the resist in the areas provided with the alignment marks and the vicinities thereof (hereinafter called "alignment mark areas") (step S12 in FIG. 2).

If this exposure is carried out by the above described device for exposure of the peripheral area, as is described below, exposure can be performed without using a special device. The production rate capacity of the exposure device, such as a stepper or the like, is prevented from being reduced.

Figure 1N:
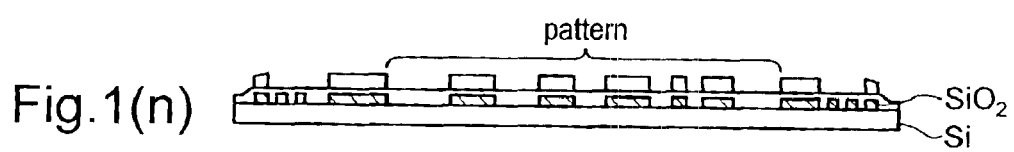

(10) The resist is developed (step S13 in FIG. 2). In a positive resist, as is shown in FIG. 1(n), the resist of the peripheral area of the wafer and on the alignment marks is dissolved and removed.

Figure 1O:
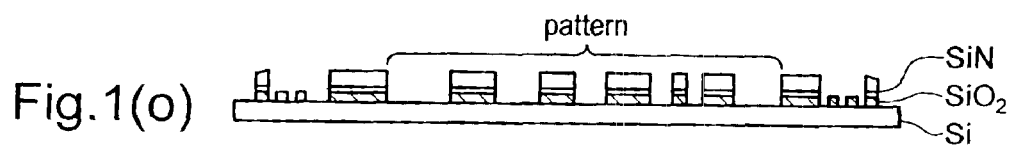
Figure 1P:
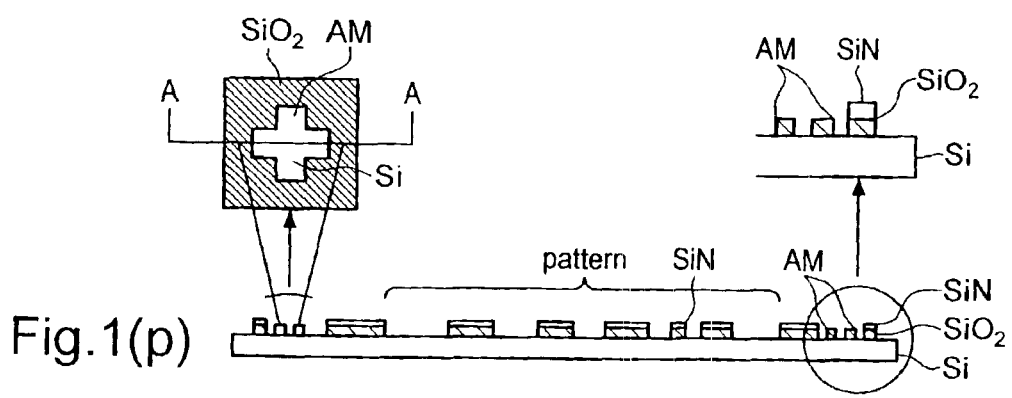

(11) As shown in FIG. 1(o), the film is etched, the resist being used as the mask (step S14 in FIG. 2). The film in the area which has no resist is eliminated. This treatment removes the SiN film with which the peripheral area of the wafer and the alignment marks AM were covered. The alignment marks formed in the oxide film are exposed.

(12) The resist is removed (step S15 in FIG. 2). In this way, the second pattern layer is formed, as is shown in FIG. 1(p).

Then, in the same way for each exposure of the third element pattern, the fourth element pattern, the n-th element pattern, the alignment mark areas are exposed, the resist on the alignment mark areas is eliminated and etching is performed in the above described manner.

The alignment marks are exposed and the image detectability can be ensured by the above described measure that, in the exposure-etching processes, starting with the second time, before etching, the resist in the alignment mark areas undergoes spot exposure and is removed by development.

An exposure process for exposure of the above described alignment mark areas and the peripheral areas thereof is described below.

The above described exposure can be accomplished by a device for exposing the peripheral area which has the same arrangement as the device for exposing the peripheral area which is described in commonly-owned, co-pending, U.S. patent application Ser. No. 10/151,182 (which is hereby incorporated by reference to the extent necessary to complete an understanding of this invention), or the like. A case is described below in which, using the device for exposing the peripheral area, the above described exposure is performed. Furthermore, using an exposure device, besides the device for exposing the peripheral area of a wafer, alignment marks can also be exposed.

Figure 3:
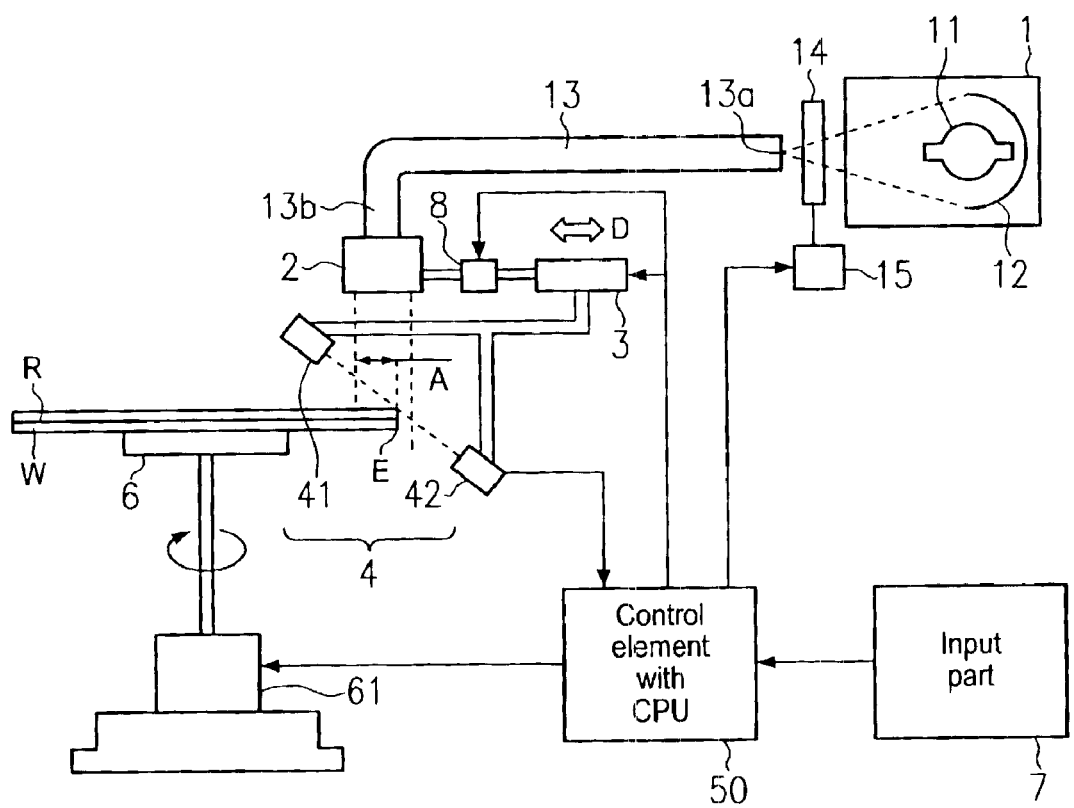
FIG. 3 is a schematic representation of the arrangement of an exposure device according to the first embodiment of the invention.

FIG. 3 shows the arrangement of an exposure device according to the first embodiment of the invention.

In FIG. 3, a light source part 1, in which there is a lamp 11, emits light which contains UV radiation, such as, for example, a super-high pressure mercury lamp with a rated wattage of 250 W. The radiant light from this lamp 11 is focused by means of a focusing mirror 12 on the incidence face side 13a of optical fibers 13.

Between the lamp 11 and the incidence face side 13a of the optical fibers 13, there is a shutter 14 which is opened or closed by a drive device 15 that moves the shutter 14 into and out of the path of light from light source part 1.

When a shutter closing signal is sent from the operation part CPU within a control element 50, the device 15 for driving the shutter 14 opens the shutter 14. In this way the light focused by means of the focusing mirror 12 is incident on the incidence face side 13a of the optical fibers 13 and is emitted as exposure light with a given irradiation area S from an exposure light outlet part 2 which is attached on the outlet face side 13b of these optical fibers 13.

The exposure light outlet part 2 is located in a part with a means for wafer edge determination 4 which has a projection part 41 and a light receiving part 42 and is movably held by a device 3 for moving the means for wafer edge determination 4 in the direction which is essentially perpendicular to the tangent to the edge E of the wafer W, i.e., essentially in the direction toward the middle of the wafer (in both directions of the arrow D in FIG. 3).

Therefore, the exposure light emitted from the exposure light outlet part 2 with the given irradiation area S moves in the same direction and by the same amount as the means for wafer edge determination 4.

On the other hand, a wafer W is seated on the rotary stage 6; the outside peripheral area of the wafer is provided with a notch N (FIG. 9) to which a photoresist R has been applied and which is attached by a holder (not shown), for example, by vacuum suction. (A case of a notch is described below. This can however also be an orientation flat). The rotary stage 6 is pivotally held by a rotary stage rotation device 61.

If a stage rotation start signal is sent from the operating part CPU within the control element 50, the rotary stage rotation device 61 begins the rotation of the rotary stage 61 based on data such as the rotational speed, angle of rotation, rotational frequency, and the like, which were input into an input part 7.

Exposure of the wafer peripheral area by the above described device takes place as is disclosed in the aforementioned U.S. patent application Ser. No. 10/151,182 in the manner described below.

Figure 10:
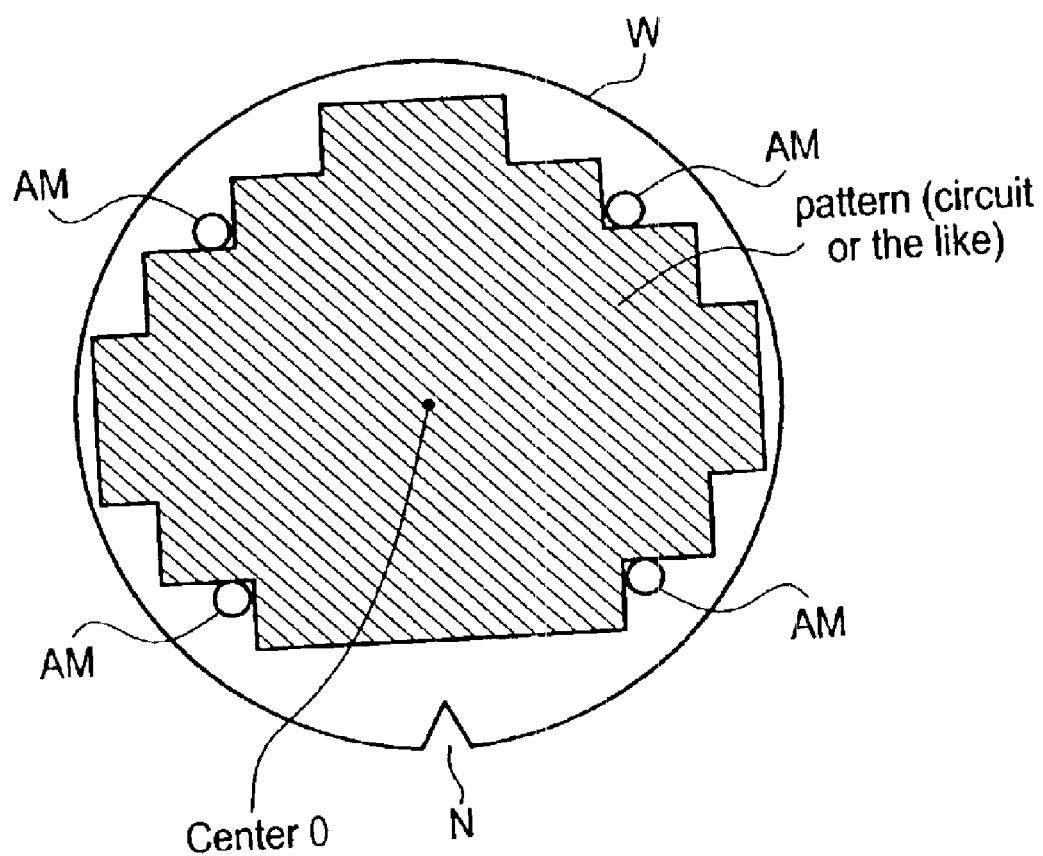
FIG. 10 shows a known arrangement of alignment marks in the peripheral area of the region of the pattern which is formed on the wafer.
Figure 11A:
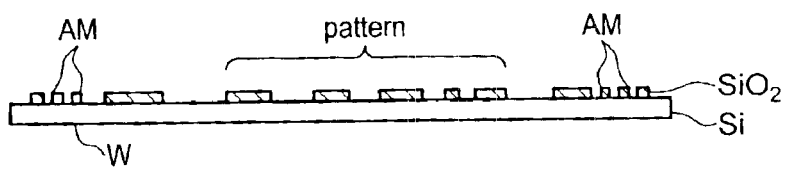
FIGS. 11(a) to 11(n) each schematically show a respective step in the area of the region of a pattern by a conventional process.
Figure 11B:
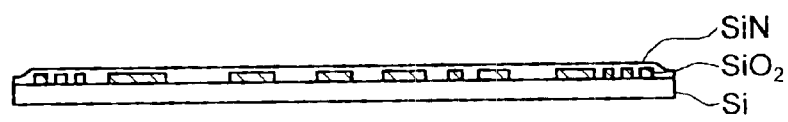
Figure 11C:
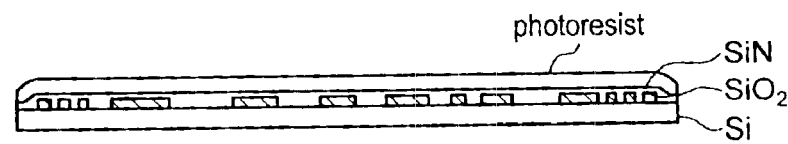
Figure 11D:
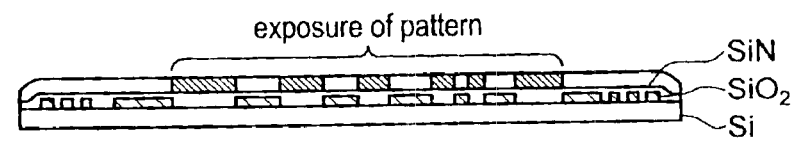
Figure 11E:
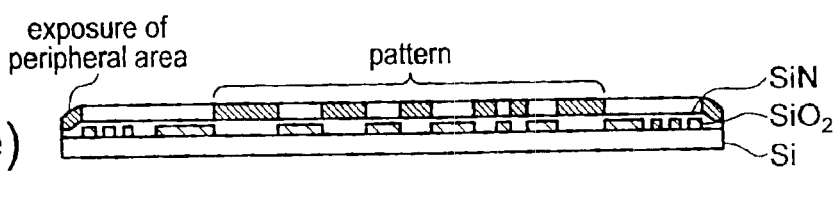
Figure 11F:
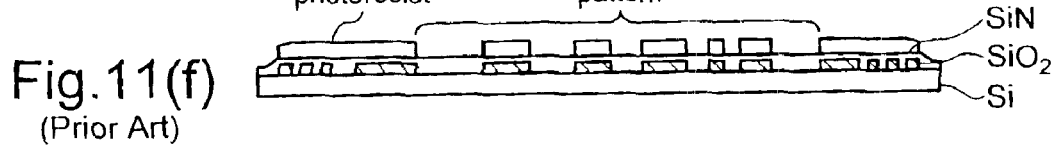
Figure 11G:
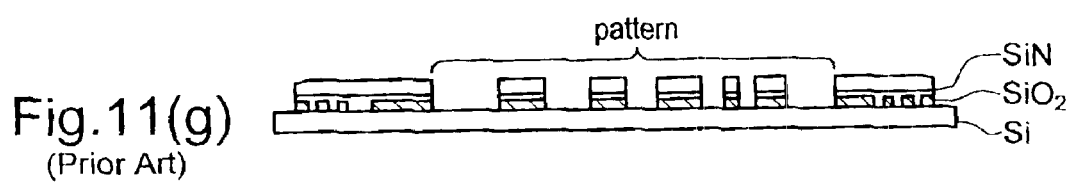
Figure 11H:
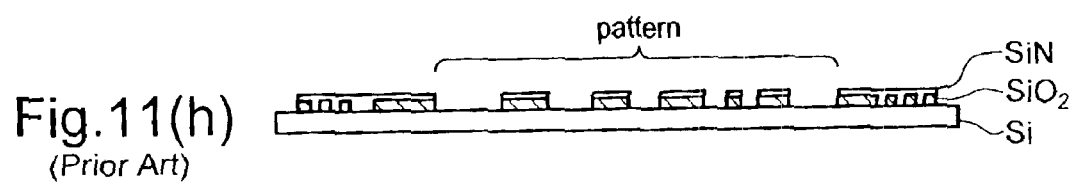
Figure 11I:
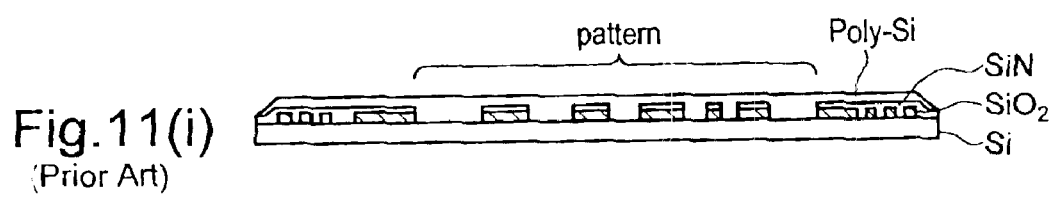
Figure 11J:
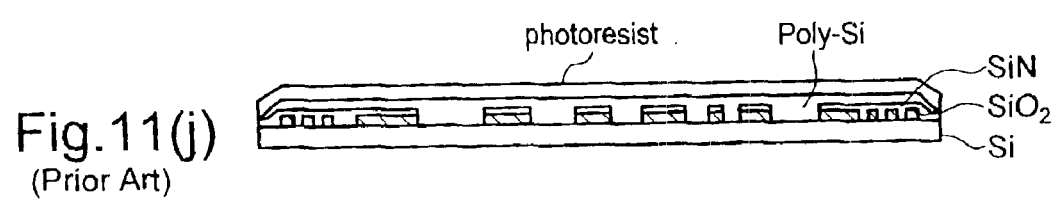
Figure 11K:
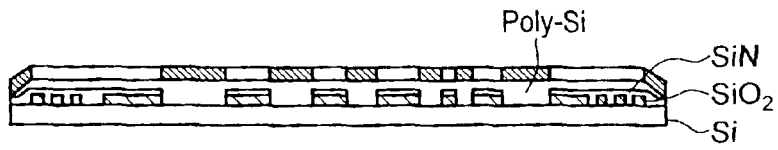
Figure 11L:
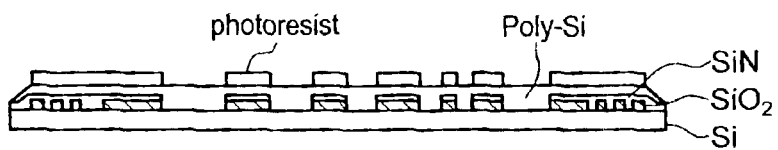
Figure 11M:
Figure 11N:
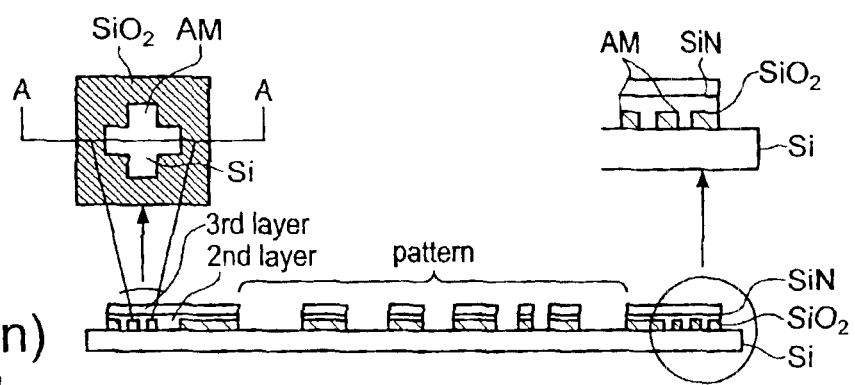

(1) The wafer W with an outside peripheral area which is provided with a notch N, to which the photoresist R has been applied and which is provided with the alignment marks AM, as was shown above using FIG. 10, is transported by a wafer transport and seating means (not shown) and is seated on the rotary stage 6 in the state in which the middle O of the wafer W and the center of rotation of the rotary stage 6 essentially agree.

(2) The controller 50 drives an exposure width adjustment device 8 based on data of an exposure width A (a width to be exposed proceeding from the edge E of the wafer W) which were input beforehand into the input part 7, and moves the area S irradiated with the exposure light to the desired position.

(3) The control element 50 drives the device 3 for moving the wafer edge determination means and moves the means for wafer edge determination 4 in the direction to the wafer and determination of the position of the edge E of the wafer W is started by the means for wafer edge determination 4.

(4) When the wafer edge has been determined, the control element 50 drives the shutter drive device 15 and opens the shutter 14. The peripheral area of the wafer W is irradiated with exposure light with the given irradiation area S via the exposure light outlet part 2. Furthermore, the control element 50 almost simultaneously with the opening of the shutter 14 drives the rotary stage rotation device 61 and exposes the peripheral area of the wafer W while it turns the wafer W. In doing so, the control element 50 controls the device 3 for moving the means for wafer edge determination 4 and moves the means for wafer edge determination 4 to a position at which the means for wafer edge determination 4 outputs a signal to the control element 50 which shows that the edge E of the wafer W is always captured. As was described above, the area S irradiated with the exposure light before exposure is moved to a position at which the area with the width A proceeding from the edge E of the wafer W can be exposed when the means 4 for determination of the wafer edge locates the edge E of the wafer W. As was described above, the area S irradiated with the exposure light before exposure is moved to a position at which the area with the width A proceeding from the edge E of the wafer can be exposed when the means 4 for determination of the wafer edge captures the edge E of the wafer W. Moreover, this irradiation area S, upon exposure, is synchronized with the means for wafer edge determination 4 and is moved in the same direction and by the same amount. Therefore, the peripheral area of the wafer W can be exposed at the exposure width A which is constant proceeding from the edge E of the wafer W.

(5) When exposure of the peripheral area of the wafer W is completed, the control element 50 closes the shutter 14, ends rotation of the rotary stage 6, and furthermore, brings the exposure light outlet part 2 back to the initial position.

In the above described exposure of the peripheral area, as was described in the above referenced U.S. patent application Ser. No. 10/151,182, or the like, based on the amount of change of the output of the means for wafer edge determination 4, the position of the notch N can be determined upon reception of a signal which shows the start of the notch N, the motion of the exposure light outlet part 2 in the radial direction of the wafer can be stopped and upon reception of the signal which shows the end of the notch the motion of the exposure light irradiation part 2 can begin again in the radial direction of the wafer. In this way, the disadvantage that the irradiation area in the notch area of the wafer moves in a V-shape and that the area which is within the wafer and which need not be exposed is also exposed can be eliminated.

After completion of the exposure of the wafer peripheral area the wafer W is turned and at the same time the exposure light outlet part 2 is moved so that the positions of the alignment marks AM on the wafer W are irradiated with the exposure light. As was described above using FIG. 1(*m*) the alignment mark areas are exposed.

Figure 4A:
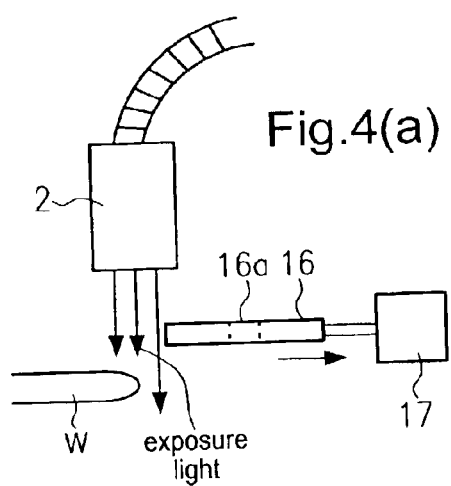
FIGS. 4(a) & 4(b) each show a respective position of a shielding plate and a device for moving the shielding plate.
Figure 4B:
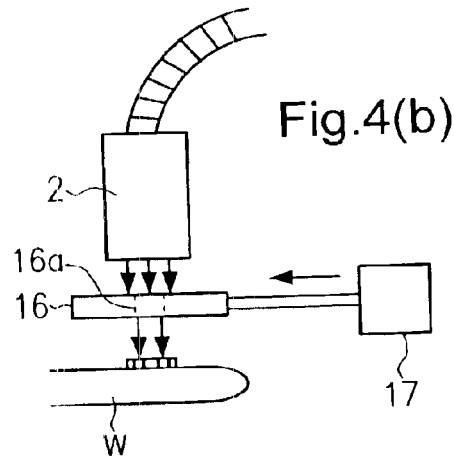

To carry out this exposure, in the exposure device in this embodiment, as is shown in FIGS. 4(*a*) and 4(*b*), there are a shielding plate 16 with an opening part 16*a* which corresponds to the size of the alignment mark, and a device 17 for moving the shielding plate which is used for insertion/removal of the shielding plate 16. Upon exposure of the peripheral area, as shown in FIG. 4*a*, the shielding plate 16 is removed. In the exposure of the alignment mark areas, as shown in FIG. 4(*b*), the shielding plate 16 is pushed between the exposure light outlet part 2 and the wafer W.

Figure 5A:
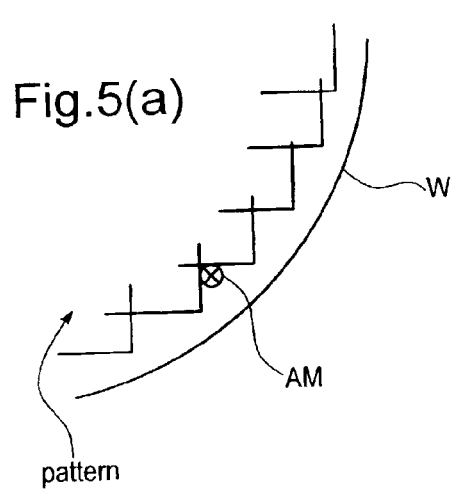
FIGS. 5(a) & 5(b) each show a respective arrangement of an alignment mark.
Figure 5B:
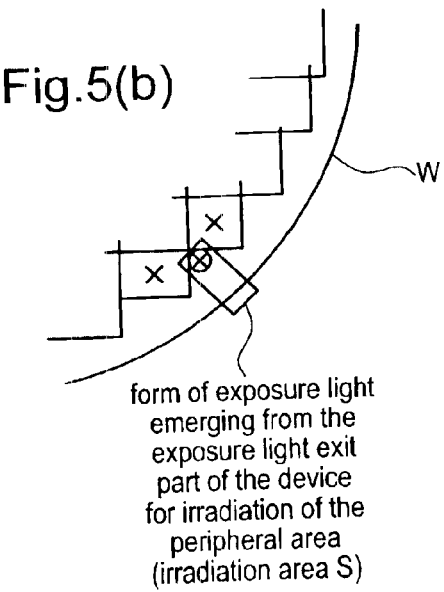

The reason for the arrangement of the shielding plate 16 and the device 17 for moving the shielding plate is the following:

As is shown in FIG. 5(*a*), the alignment mark AM is arranged in the vicinity of the pattern, such as a circuit or the like. The light emerging from the exposure light outlet part 2 has a rectangular shape of, for example, roughly 5 mm×7 mm or roughly 5 mm×5 mm, as is shown in utility model publication HEI 5-30349. The shape of the irradiation area S projected onto the wafer is rectangular. When the vicinity of the alignment marks is exposed with this rectangular light, as is shown in FIG. 5(*b*), the pattern in the vicinity of the alignment marks is irradiated with the exposure light, by which this pattern can no longer be used.

The exposure light is therefore shaped into spot light and emitted. Thus, as is shown in FIGS. 4(*a*) & 4(*b*), there are a shielding plate 16 with an opening part 16*a* with a diameter of roughly 2 mm and a device 17 for moving the shielding plate. In the exposure of the peripheral area the shielding plate 16, as shown in FIG. 4(*a*), is removed by the device 17 for moving the shielding plate outside the area which is irradiated with the exposure light from the exposure light outlet part 2. Exposure is performed by rectangular light. When the alignment mark areas are exposed, as shown in FIG. 4(*b*), the shielding plate 16 is inserted into the exposure light irradiation area by the device 17 for moving the shielding plate, and the wafer W is exposed via the opening part 16*a* of the shielding plate 16. Since the exposure light is shaped into a smaller spot light, only the resist on the alignment marks and in the peripheral area thereof is exposed. The reason for the insertion of the shielding plate 16 between the exposure light outlet part 2 and the wafer W lies in preventing a ghost by the lens located in the exposure light outlet part 2, as is described in Japanese utility model publication HEI 6-9487. Even if there is an aperture on the light inlet side of the lens, and the light is shaped, spot light with good contrast cannot be obtained due to the ghost of the lens.

Figure 6:
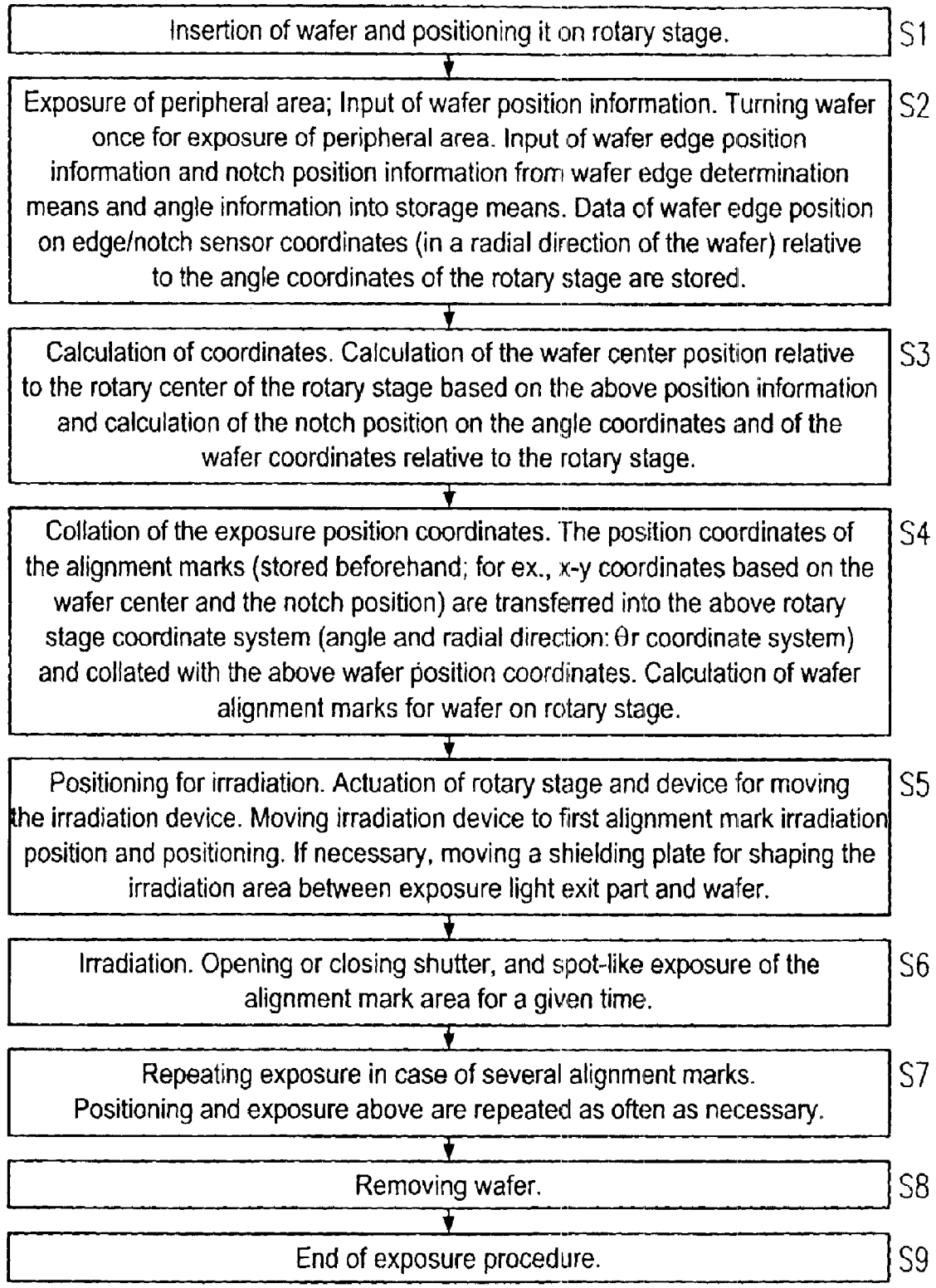
FIG. 6 is a flow chart of the treatment sequence of exposure of the alignment mark regions.

FIG. 6 shows the treatment sequence of exposure of the alignment mark areas. The exposure sequence of the alignment mark areas is described below using FIG. 6.

(1) The position of the alignment marks to be exposed is input beforehand from the input part 7 and it is stored in the control element 50. For example, the position coordinates of the respective alignment mark $(x_1, y_1), (x_2, y_2), \ldots (xn, yn)$ is stored in a X-Y coordinate system in which the wafer center and the singularly shaped point (middle of the notch or the orientation flat) are taken as a reference, in the control element 50.

(2) The wafer W is seated on the rotary stage 6 (step S1 in FIG. 6). In the case in which following the prior exposure of the peripheral area the alignment mark areas are exposed, the wafer W can also remain on the rotary stage 6.

(3) By turning the rotary stage 6, the wafer W is turned. The position of the wafer edge E is determined by the means for wafer edge determination 4. An edge position signal is sent to the control element 50 of the device for exposing the peripheral area.

This means that the wafer W is turned once and in the meantime the wafer edge position signal and the notch position information which are obtained by the means for wafer edge determination 4, and the angle information of the rotary stage 6 are input into a storage means of the control element 50.

In this way, the position coordinates determined by the means for wafer edge determination 4 (coordinates in the radial direction of the wafer) are stored with respect to the rotational angle coordinates of the rotary stage 6 as the wafer edge position data in the control element 50 (step 2 in FIG. 6).

In the case in which, following the prior peripheral area exposure, the alignment mark areas are exposed, and in the case in which the wafer edge position data with respect to the rotational angle information of the rotary stage 6 were determined in the above described peripheral area exposure, this process is not always necessary.

(4) The control element 50, based on the edge position signal determined from the means for wafer edge determination 4 computes the position of the wafer edge E. Based on the amount of change of the above described edge position signal the position of the notch or the orientation flat of the wafer W is determined, and the center thereof (this point is called a "singularly shaped point") is computed.

Based on the position information of the wafer edge and the position information of the singularly shaped point which were computed above, the control element 50 determines the amount and direction of deviation of the middle position O of the wafer W on the rotary stage 6 from the position of the center of rotation of the rotary stage 6 and furthermore computes the position of the singularly shaped point on angle coordinates (step S3 in FIG. 6).

(5) The position coordinates $(x_1, y_1), (x_2, y_2), \ldots (x_n, y_n)$ of the alignment marks which were input above in (1) are converted into a coordinate system (angle and radial direction: θr-coordinate system) of the rotary stage and collated with the position coordinates of the wafer determined above in (4).

The positions of the alignment marks AM on the wafer seated on the rotary stage 6 (step S4 in FIG. 6) are computed. This means that the positions $(\theta_1, r_1), (\theta_2, r_2), \ldots (\theta_{n, m})$ of the alignment marks AM are determined in the coordinate system (θr coordinate system) of the rotary stage 6. The distance $r_1, r_2$ can be fixed in the radial direction by the distance from the wafer middle or also by the distance from the wafer edge E.

(6) The rotary stage 6 is turned, and at the same time, the exposure light outlet part 2 is moved. The irradiation area of the exposure light outlet part 2 is moved to the exposure position $(\theta_1, r_1)$ of a first alignment mark and carries out positioning.

Here, the shielding plate 16 is pushed between the exposure light outlet part 2 and the wafer W (step S5 in FIG. 6). In the case in which the alignment marks AM and the pattern are apart from one another and in which without inserting the shielding plate 16 the pattern in the vicinity of the alignment marks is not irradiated with the exposure light, the shielding plate need not be inserted.

(7) The shutter 14 is opened and the alignment marks AM and the peripheral areas thereof are exposed spot-like for a given time (step S6 in FIG. 6).

(8) In the case in which there are several alignment marks AM for exposure, the treatments described above in (6) and (7) are repeated in the same way as the above described manner for $(\theta_2, r_2), \ldots, (\theta_n, r_n)$ and the respective alignment mark and its peripheral area are exposed (step S7 in FIG. 6).

(9) When exposure is ended, the wafer W is transported out.

By exposing the alignment mark areas in the above described manner, as was described above, the resist can be eliminated in the alignment mark areas. Therefore, a multilayer film is prevented from being formed on the alignment mark areas. This makes it possible to improve the visual recognizability of the alignment marks when positioning the mask to the workpiece and to determine them easily.

Furthermore, by exposing the alignment mark areas using the device for exposing the peripheral area in the above described manner, neither a special device for exposing the alignment mark areas is needed nor do the alignment mark areas need to be exposed by a stepper.

Furthermore, using the original function which the device for exposing the peripheral area has, the alignment mark areas can be exposed. Since the function of carrying out the treatment shown in FIG. 6 is added to the device for exposure of the peripheral area and at the same time, if necessary, the shielding plate 16 and the device 17 for moving the shielding plate can be added, the cost increase of the device for exposing the peripheral area is also low.

Furthermore, since, after carrying out peripheral area exposure in the state in which the wafer is seated on the rotary stage of the device for exposing the peripheral area, the alignment mark areas can be exposed, it is not necessary to transport the wafer and place it in another device. This exposure can be done within a short time.

Figure 7:
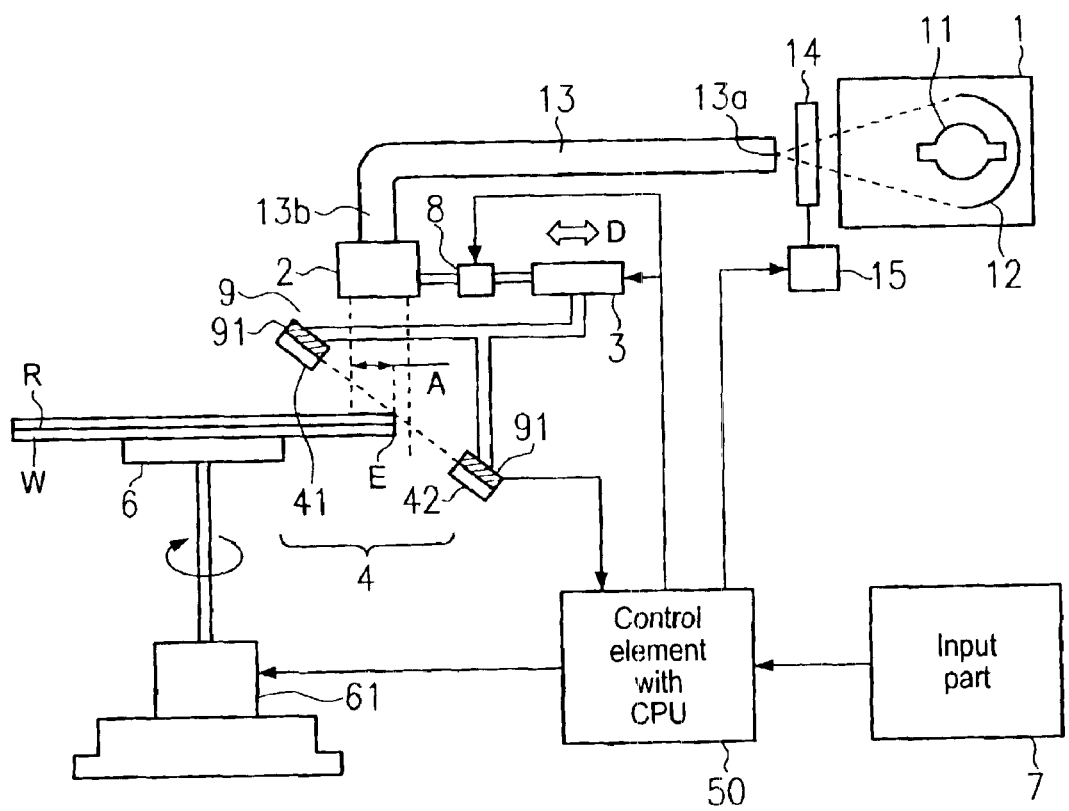
FIG. 7 is a schematic representation of the arrangement of an exposure device according to a second embodiment of the invention.

FIG. 7 shows a schematic of the arrangement of an exposure device according to a second embodiment of the invention. The arrangement in this embodiment is identical to the arrangement of the exposure device shown in the first embodiment. In the exposure device in this embodiment, as was described in the aforementioned U.S. patent application Ser. No. 10/151,182, besides the means for wafer edge determination, there is the above described means for determining the position of the notch (or the orientation flat).

In FIG. 7, as was described above, the exposure light outlet part 2 is located in a part with the means for wafer edge determination 4. The exposure light emitted by the exposure light outlet part 2 with the given irradiation area S moves in the same direction and by the same amount as the means for wafer edge determination 4. Furthermore, the notch determination means 9 which carries out only a determination of the notch N, is located in one piece with the means for wafer edge determination 4.

Figure 8:
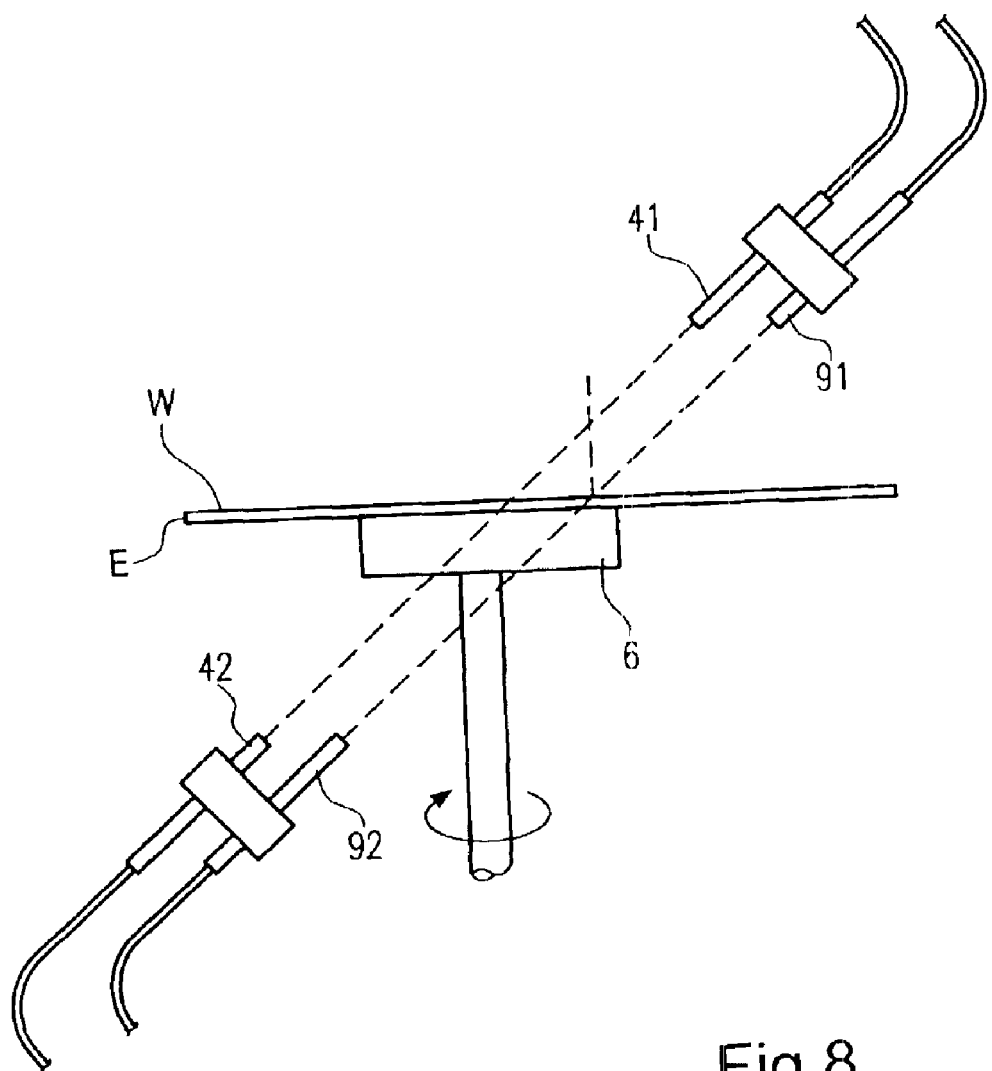
FIG. 8 shows the arrangement of a means for wafer edge determination and a notch determination means.

FIG. 8 shows the arrangement of the means for wafer edge determination and the notch determination means. The means for wafer edge determination 4 is comprised of a projection part 41 which projects sensor light and of a light receiving part 42 which receives this sensor light and outputs an analog signal to the control element 50 which, depending on the amount of light of the sensor light projected by the projection part 41 onto the light receiving part 42, increases or decreases. The control element 50, as was described above, controls the device 3 for moving the means for determination of the wafer edge based on the output of the means for wafer edge determination 4, and moves the means for wafer edge determination 4 to the position at which the means for wafer edge determination 4 outputs a signal to the control element 50 which shows that the edge E of the wafer W has been acquired.

The notch determination means 9, like the means for wafer edge determination 4, is comprised of a projection part 91 which projects sensor light, and of a light receiving part 92 which receives this sensor light, and is located in one piece with the means for wafer edge determination 4. Projection part 91 projects the sensor light onto the vicinity of the wafer edge E.

The control element 50 processes the signal from the light receiving part 92 of the notch determination means 9, and based on the input signal value, determines the start and the end of the notch N. This means that, because the input signal value becomes greater than the preset value, the start of the notch N is determined. Because the input signal value becomes smaller than the present value, the end of the notch is determined. The singularly shaped point is determined by computation of the middle point of the initial position and the end position of the notch.

Peripheral area exposure and exposure of the alignment mark areas in this embodiment are identical to the exposure using the device described in the first embodiment, except for the fact that the notch determination means 9 determines the notch position and the singularly shaped point of the wafer W, and the same effect can be obtained as in the first embodiment.

In this embodiment, as was shown in FIGS. 4(*a*) & 4(*b*), there can be a shielding plate 16 and a device 17 for moving the shielding plate and in the exposure of the peripheral area the shielding plate 16 can be removed, as is shown in FIG. 4(*a*), and in the exposure of the alignment mark areas the shielding plate can be inserted between the exposure light outlet part 2 and the wafer W, as is shown in FIG. 4(*b*).

Figure 9:
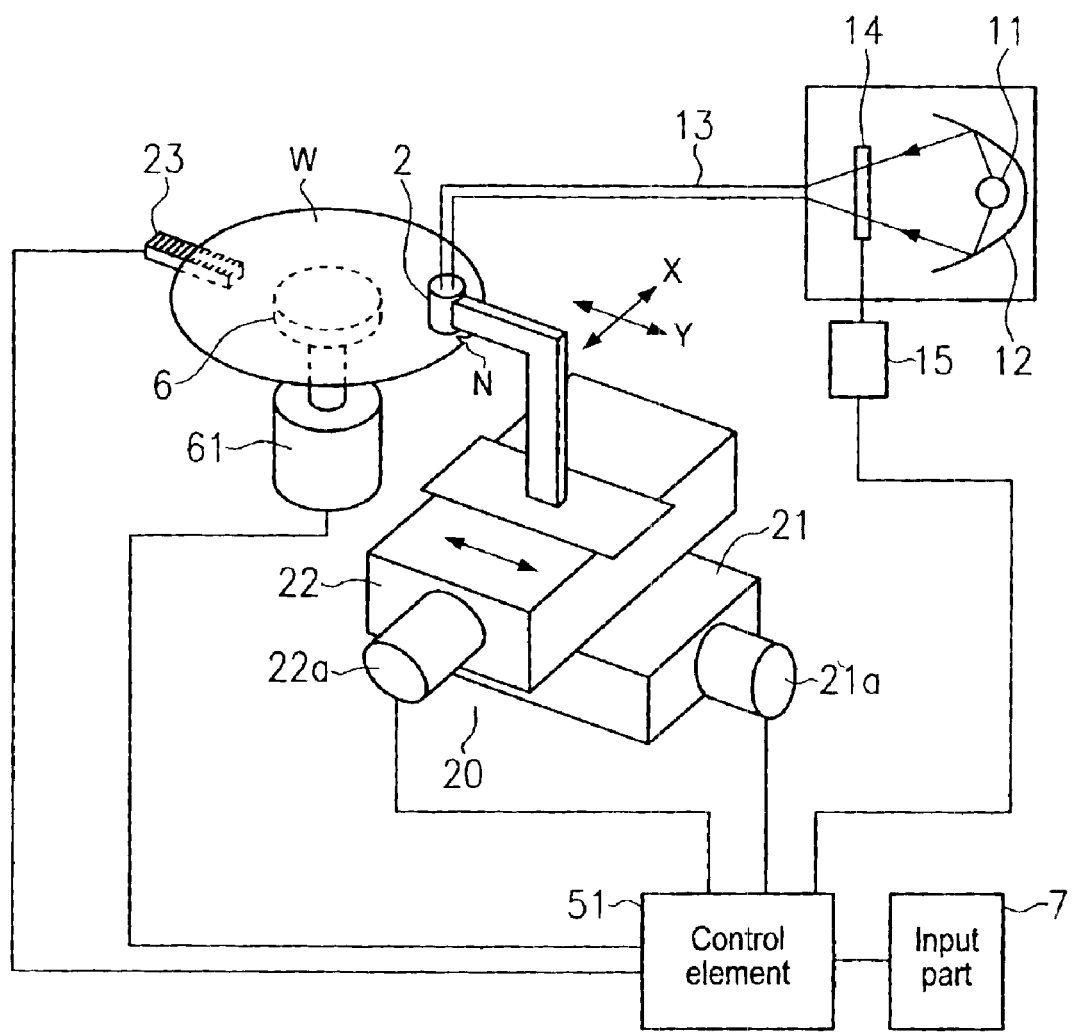
FIG. 9 is a schematic representation of the arrangement of an exposure device according to a third embodiment of the invention.

FIG. 9 shows the arrangement of an exposure device according to a third embodiment of the invention. In the exposure device in this embodiment, the invention is used for an exposure device in which the peripheral area of the wafer is gradually exposed by moving the exposure light outlet part 2 in the X-Y directions.

In FIG. 9, a light source part I has a lamp 11 which emits light which contains UV radiation, such as a super-high pressure mercury lamp or the like. The radiant light from this lamp 11 is focused by means of a focusing mirror 12 on the incidence face side of optical fibers 13.

Between the lamp 11 and the incidence face side of the optical fibers 13, there is a shutter 14, as was described above. The shutter 14 is opened when a shutter opening signal is sent from the control element 51. In this way, exposure light with a given irradiation area S is emitted from the exposure light outlet part 2, as was described above.

The exposure light outlet part 2 is mounted in a device 20 for moving the irradiation area which controls and moves the exposure light outlet part 2 in the X-Y directions. The device 20 for moving the irradiation area has an X-table 21, a Y-table 22 and motors 21*a* and 22*a* for driving them. By driving the X-table 21 by the motor 21*a*, the exposure light outlet part 2 moves in the X-direction in FIG. 9. The exposure light outlet part 2 in the Y-direction in FIG. 9 is moved by the drive of the Y table by the motor 22*a*.

On the other hand, a wafer W is seated on the rotary stage 6; the outside peripheral area of the wafer is provided with a notch N to which a photoresist R which is provided with alignment marks AM has been applied and which is attached by a holding means which is not shown in the drawings, for example, by vacuum suction. (A case of a notch is described below. This can however also be an orientation flat). The rotary stage 6 is pivotally held by a rotary stage rotation device 61.

Furthermore, a means 23 for determination of the wafer edge is comprised of a CCD array sensor or the like. The wafer W is turned by the rotary stage 6. The means 23 for determination of the wafer edge determines the position of the wafer edge E. In this way, as was described above, the edge of the wafer and the position of the singularly shaped point formed in the wafer W are determined.

Exposure of the wafer peripheral area by the above described device takes placed as follows.

(1) The wafer W with an outside peripheral area which is provided with a notch N and to which the photoresist R has been applied is transported by a wafer transport and seating means (not shown) and is seated on the rotary stage 6 in the state in which the middle O of the wafer W and the center of rotation of the rotary stage 6 essentially agree with one another.

(2) The rotary stage drive device 61 turns the rotary stage 6 and the wafer W is turned once. During rotation of the wafer, the edge position of the wafer W is determined by the means 23 for determination of the wafer edge. As was described above, based on the edge position information of the wafer W, the amount of deviation of the center of the wafer W from the center of rotation of the rotary stage 6 is determined, and moreover the position of the singularly shaped point of the wafer W is determined and stored.

(3) Based on the above described data, the rotary stage 6 is turned until a line which forms between the singularly shaped point and the wafer middle becomes parallel to the Y axis of the X-Y coordinate system shown in FIG. 9.

(4) Based on the amount of deviation of the center of rotation of the rotary stage 6 determined above in (2) and based on the position of the singularly shaped point of the wafer W, the control element determines the amount of motion of the exposure light outlet part 2 and moves the exposure light outlet part 2 by the device 20 for moving the irradiation area of the wafer such that the light emerging from the exposure light outlet part 2 is emitted onto the exposure starting position of the wafer W.

(5) The shutter 14 is opened. Exposure light is emitted from the exposure light outlet part 2 onto the peripheral area of the wafer W, and thus, the wafer peripheral area is gradually exposed.

The above described peripheral area exposure in which the wafer peripheral area is gradually exposed is disclosed, for example, in Japanese patent disclosure document HEI 4-291914 and in U.S. Pat. No. 5,929,975). In the exposure device shown in FIG. 9, it is possible to proceed in the same way.

Exposure of the alignment mark areas using the exposure device shown in FIG. 9 can also be carried out in the same way as using the exposure device shown in FIG. 3. Exposure of the alignment mark areas using the device in this embodiment is described below in a simplified manner.

(1) As was described above, the position of the alignment mark AM to be exposed is input by the input part 7 and stored in the control element 51. This means that the position coordinates of the respective alignment mark in an X-Y coordinate system in which the wafer middle and the singularly shaped point are taken as a reference are stored in the control element 51, as was described above.

(2) The wafer is seated on the rotary stage 6. In the case in which, following the prior exposure of the peripheral area, the alignment mark areas are exposed, the wafer W can also remain on the rotary stage 6.

(3) By turning the rotary stage 6, the wafer W is turned. The position of the wafer edge E is determined by the means 23 for determination of the wafer edge. An edge position signal is sent to the control element 51 of the device for exposing the peripheral area.

This means that the wafer W is turned once, and in the meantime, the wafer edge position signal and the notch position information which are obtained by the means 23 for determination of the wafer edge, and the angle information of the rotary stage 6 are input into a storage means of the control element 51.

In this way, they are stored as wafer edge position data with respect to the rotational angle coordinates of the rotary stage 6 in the control element 51.

(4) The control element 51, based on the edge position signal from the means 23 for determination of the wafer edge, computes the position of the wafer edge E. Based on the amount of change of the above described edge position signal, the position of the notch N or the orientation plane of the wafer is determined, and the center thereof (this point is called a "singularly shaped point") is computed.

Based on the position information of the wafer edge E and the position information of the singularly shaped point which were computed above, the control element 51 determines the amount of deviation of the middle position of the wafer W on the rotary stage 6 from the position of the center of rotation of the rotary stage 6, and furthermore, computes the position of the singularly shaped point on the angle coordinates.

(5) Based on the above described data, the rotary stage 6 is turned until a line which forms between the singularly shaped point and the wafer middle becomes parallel to the Y axis of the X-Y coordinate system shown in FIG. 9.

In the case in which, following the prior peripheral area exposure, the alignment mark areas are exposed, and in the case in which the wafer edge position data with respect to the rotational angle information of the rotary stage 6 were determined in the above described peripheral area exposure, and in which the singularly shaped point is in the state parallel to the Y axis of the X-Y coordinate system shown in FIG. 9, the processes described above in (3) to (4) are not always necessary.

(6) The exposure light outlet part 2 is moved such that the irradiation area of the exposure light outlet part 2 agrees with the position coordinates of the alignment marks input above in (1), the position of the above described singularly shaped point being taken as a reference, and thus positioning is performed.

Here, if necessary, the shielding plate 16 as shown in FIG. 4 is inserted between the exposure light outlet part 2 and the wafer.

(7) The shutter 14 is opened and the alignment marks AM and the peripheral areas thereof are exposed spot-like for a given time.

(8) In the case in which there are several alignment marks AM for exposure, the respective alignment mark and its peripheral area are exposed in the same manner as described above.

(9) When exposure is ended, the wafer W is transported out.

As was described above, in this embodiment, as in the first embodiment, by exposing the alignment mark areas, the resist can be eliminated in the alignment mark areas. Therefore, a multilayer film is prevented from being formed on the alignment mark areas. This makes it possible to easily determine the alignment marks when positioning the mask to the workpiece.

Furthermore, by exposing the alignment mark areas using the device for exposing the peripheral area in the above described manner, neither a special device for exposing the alignment mark areas is needed nor do the alignment mark areas need to be exposed by a stepper.

Also, using the original function which the device for exposing the peripheral area has, the alignment mark areas can be exposed. Since a pair of functions are added to the device for exposure of the peripheral area and at the same time, if necessary, the shielding plate and the device for moving the shielding plate can be added, the cost increase of the device for exposing the peripheral area is also low.

Furthermore, after carrying out peripheral area exposure in the state in which the wafer is seated on the rotary stage of the device for exposing the peripheral area, since the alignment mark areas can be exposed, it is not necessary to transport the wafer and place it in another device. Exposure can be done within a short time.

Action of the invention

As was described above, the follow effects can be obtained in the invention.

(1) Since, upon each exposure of the mask pattern onto the substrate, the areas which are provided with the alignment marks are irradiated with exposure light and the photoresist is exposed on the areas provided with the alignment marks, the resist in the alignment mark areas can be eliminated. Even if the process continues, a multilayer film is prevented from being formed on the alignment mark areas. This makes it possible to improve the visual recognizability of the alignment marks when positioning the mask to the workpiece and to determine them easily.

(2) By exposing the alignment marks areas using the device for exposing the peripheral area, the exposure of the alignment mark areas need not be done by the stepper, by which the production rate capacity of the stepper can be increased.

(3) By the measure that the device for exposure of the peripheral area acquires the function of exposure of the alignment mark areas, it is not necessary to procure a device for exposing the alignment marks in addition when the process is carried out in peripheral exposure.

(4) A device for exposing the peripheral area and a device for exposing the alignment mark areas can be used. The areas of the alignment marks can also be exposed only by adding some functions to the device for exposing the peripheral area. The increase in costs is thus low.

The insertion of the shielding plate between the exposure light outlet part and the wafer can prevent ghosts by the lens located in the exposure light outlet part when the alignment mark areas are exposed and spot light with good contrast can be obtained, as was described above.

I claim:

1. Peripheral exposure device for exposing a substrate with a surface which is provided with alignment marks, with an outside peripheral area provided with a singularly shaped point, and to which a photoresist has been applied, comprising:

a rotary stage on which the substrate is seated, movement means for producing relative movement between the rotary stage and an area irradiated with exposure light from a light source, a means for determining the singularly shaped point and an edge position which determines the singularly shaped point and an edge position of the substrate; and a control element adapted to store position information of the alignment marks formed on the substrate, and which, based on edge position information and the position information about the singularly shaped point which has been obtained by the means for determining, and based on position information of the alignment marks formed on the above described substrate, and adapted to compute positions of the alignment marks on the substrate seated on the rotary stage, wherein, based on the positions computed by the control element, said movement means is adapted to bring the area which is irradiated with exposure light, and the positions of the alignment marks into agreement with one another for exposing the photoresist which has been applied to the areas at which the alignment marks are formed.

2. Peripheral exposure device as claimed in claim 1, further comprising a shielding plate with an opening which corresponds to the size of the alignment marks formed on the substrate, and a drive device for driving the shielding plate for inserting and removing the shielding plate from between light source and the area irradiated with exposure light, the drive device inserting the shielding plate for exposure of the photoresist applied to the alignment marks.

3. Peripheral exposure device for exposing a substrate with a surface which is provided with alignment marks, with an outside peripheral area provided with a singularly shaped point, and to which a photoresist has been applied, comprising:

a rotary stage on which the substrate is seated with which the substrate is turned, means for determining the singularly shaped point and edge position of the substrate, said means comprising a projection part which projects sensor light and of a light receiving part which receives the sensor light for determining the singularly shaped point and the edge position of the substrate; and a device for moving the means for determining the singularly shaped point and the edge position essentially in a direction toward the center of the substrate;

a device for moving an area irradiated with exposure light from a light source; and a control element which controls the device for moving the means for determining the singularly shaped point and the edge position such that the sensor light is projected by the projection part onto the peripheral area of the substrate so that an essentially constant amount of the sensor light emitted onto the edge area of the above described substrate is received by the light receiving part, and which controls the device for moving the irradiated area such that the above described irradiated area is moved in the same direction of motion and by the same amount of motion as the above means for determining the singularly shaped point and the edge position, wherein the control element is adapted to store position information of the alignment marks formed on the substrate, based on the edge position information and the information about the singularly shaped point which was obtained by the means for determining the singularly shaped point and the edge position, wherein, based on the position information of the alignment marks formed on the substrate, the control element is adapted to compute the positions of the alignment marks on the substrate seated on the rotary stage, and wherein, based on the positions computed, causes the position of area irradiated with the exposure light to agree with the position of the alignment marks, and causes the photoresist applied to the areas provided with the alignment marks to be exposed.

4. Peripheral exposure device as claimed in claim 3, further comprising a shielding plate with an opening which corresponds to the size of the alignment marks formed on the substrate, and a drive device for driving the shielding plate for inserting and removing the shielding plate from between light source and the area irradiated with exposure light, the drive device inserting the shielding plate for exposure of the photoresist applied to the alignment marks.

* * * * *